United States Patent [19]
Taskar et al.

[11] Patent Number: 6,113,691
[45] Date of Patent: Sep. 5, 2000

[54] ULTRA-LOW PRESSURE METAL-ORGANIC VAPOR PHASE EPITAXY (MOVPE) METHOD OF PRODUCING II-IV SEMICONDUCTOR COMPOUNDS AND II-VI SEMICONDUCTOR COMPOUNDS THUS PRODUCED

[75] Inventors: Nikhil R. Taskar, Ossining; Donald R. Dorman, Carmel, both of N.Y.; Dennis Gallagher, Stamford, Conn.

[73] Assignee: Philips Electronics North America Corporation, New York, N.Y.

[21] Appl. No.: 08/451,341

[22] Filed: May 26, 1995

[51] Int. Cl.$^7$ .................................................. C30B 25/16
[52] U.S. Cl. ............................... 117/104; 117/88; 117/92; 117/108
[58] Field of Search ..................... 117/2, 88, 92, 117/104, 106, 108; 423/508; 427/248.1; 437/11, 12, 13

[56] References Cited

U.S. PATENT DOCUMENTS

| | | | |
|---|---|---|---|
| 4,422,888 | 12/1983 | Stutius | 148/175 |
| 5,423,284 | 6/1995 | Nishimura et al. | 117/84 |
| 5,450,823 | 9/1995 | Nishmura et al. | 117/108 |

FOREIGN PATENT DOCUMENTS

| | | |
|---|---|---|
| 0206822A3 | 12/1986 | European Pat. Off. . |
| 0332198 | 9/1989 | European Pat. Off. . |
| 62-234335 | 10/1987 | Japan . |
| 9502710A1 | 1/1995 | WIPO . |

OTHER PUBLICATIONS

"P–Type ZnSe by Nitrogen Atom Beam Doping During Molecular Beam Epitaxial Growth" R.M. Park et al, Appl. Phys.Lett. 75 (20) Nov. 12, 1990 pp. 2127–2129.

"Charateristics of P–Type ZnSe Layers Grown by Molecular Beam Epitaxy With Radical Doping" L. Ohkawa et al, Japanese Journal of Applied Physics, vol. 30, No. 2A, Feb. 1991, pp. L152–L155.

"Growth Kinetics in MOMBE of ZnSe Using Dimethylzinc and Hydrogen Selenide as Reactants" A. Yoshikawa et al, Journal of Crystal Growth 94 (1989) pp. 69–74.

"Low Temperature Growth and Plasma Enhanced Nitrogen Doping of ZnSe by Metalorganic Vapor Phase Epitaxy"; Taudt, et al; J. Cryst. Growth (1994), 138 (1–4) pp. 418–424.

"Low Pressure OMVPE of ZnSe with Hydrogen Selenide and Dimethyzinc–Triethylamine;" J. Electronic Mat. vol. 22, No. 5 1993, Jeung–Soo Huh, et al.

"Low Pressure OMVPE of ZnSe with Hydrogen Selenide and Dimethylzinc–Triethylamine", by Jeung–Soo Huh et al, Journal of Electronic Materials, vol. 22, No. 5, pp. 509–514., 1993.

Primary Examiner—Felisa Garrett
Attorney, Agent, or Firm—Ernestine C. Bartlett

[57] ABSTRACT

Semiconductor compounds and a method for producing the same are provided wherein a method for growing at least one epitaxial layer of a II–VI semiconductor compound using MOVPE is used, the method including the steps of subjecting a substrate to organometallic and hydride precursor compounds in a MOVPE reactor at ultra low pressure, i.e. a pressure in the range of about 10 to 1 mTorr, whereby the organometallic and hydride precursor compounds react at a substrate surface without substantial reaction in the gas phase. The epitaxial layers and semiconductor compounds are useful in blue laser devices.

36 Claims, 6 Drawing Sheets

ULTRA-LOW PRESSURE METAL-ORGANIC VAPOR PHASE EPITAXY (MOVPE) METHOD OF PRODUCING II-IV SEMICONDUCTOR COMPOUNDS AND II-VI SEMICONDUCTOR COMPOUNDS THUS PRODUCED

FIELD OF THE INVENTION

This invention relates to a method of manufacturing epitaxial layers of Group II–VI semiconductor compounds, particularly ZnSe and its alloys, and to such semiconductor compounds, layers and alloys thus manufactured.

BACKGROUND OF THE INVENTION

Semiconductors are usually characterized as either n-type or p-type, depending upon whether the predominant carriers in the material are electrons or holes. As is known, semiconductors can be rendered n-type or p-type by substituting impurity atoms (dopants) for atoms of the host lattice which have a different valence. Donor-type impurities are those which give electrons, and thus render the host material n-type, while acceptor-type impurities are those which receive electrons, and thus render the host p-type.

Successful doping to obtain or enhance n-type or p-type conductivity depends not only upon the ability to introduce a sufficient amount of the proper dopant into the semiconductor material, but also upon the ability to position the dopant atoms in the proper substitutional sites within the material's crystal lattice where they can give or receive electrons.

Dopants which do not readily assume the proper substitutional sites in sufficient number can be activated or converted to donors or acceptors. For example, they may be activated by a thermal anneal of the doped semiconductor material.

Another important consideration is the presence of other impurities in the semiconductor material which are, or are capable of assuming, an opposite conductivity type than that intended, thus compromising the effect of the dopant. Thus, it is actually the net donor or acceptor concentration which determines the overall conductivity of the material.

Semiconductors which can be rendered either n-type or p-type with the appropriate doping such as Si, a Group IV element, and GaAs, a III–V compound, can be converted to devices such as diodes by doping adjacent regions p- and n-type to form pn junctions.

Group II–VI compounds such as ZnS and ZnSe are of great interest currently for use in semiconductor devices because of their relatively wide band gaps. For example, light-emitting diodes (LEDs) and diode lasers operating in the blue region of the visible spectrum may be formed from doped junctions in epitaxial layers of ZnSe.

In practice, it has proved to be extremely difficult to obtain stable doped ZnSe epitaxial layers. While a sufficient amount of dopant can usually be introduced into the layers, it is either difficult to convert sufficient numbers of the dopants into acceptors incorporated into the lattice of such compounds, or the acceptors are unstable. For example, lithium-doped epitaxial layers of ZnSe can be converted to p-type material, but lithium is unstable because of its tendency to diffuse, even at relatively low temperatures.

Nitrogen has been proposed as a more stable acceptor dopant than lithium, and although it can be doped into ZnSe in-situ in high concentrations, it has been found that only a small fraction of such nitrogen can be activated. Additionally, nitrogen doping by chemical vapor deposition (CVD) is difficult to accomplish because (1) parasitic chemical reactions with the zinc and selenium precursors during growth can keep nitrogen from being incorporated, and (2) nitrogen can be electrically compensated (neutralized) by hydrogen in the material.

To date, epitaxial layers of ZnSe and its alloys have been grown using techniques such as Molecular Beam Epitaxy (MBE), Metal-Organic Molecular Beam Epitaxy (MOMBE), Chemical Beam Epitaxy (CBE) and Metal-Organic Vapor Phase Epitaxy (MOVPE). The first three techniques (MBE, MOMBE and CBE) require the use of an high vacuum environment on the order of $10^{-6}$ Torr. Also, in MBE the constituent elements are supplied to the substrate from elemental sources, or in some cases from alloy compound sources. In MOMBE and CBE the metalorganic compounds and hydrides are supplied in their cracked forms (elements along with the products of thermal decomposition) or compound forms, respectively.

MOVPE is conventionally performed at pressures ranging from 800 to 1 Torr using a combination of metalorganic and hydride compounds as sources. This operational pressure range ensures a laminar flow of the reactants in the vicinity of the substrates, resulting in good uniformity over a large area.

An important difference between MOVPE and the other techniques is that the Mean Free Path (MFP) in the case of the high-vacuum techniques is several orders of magnitude larger than the source to substrate distance. As a result, interaction between the various species occurs only at the surface of the substrate. In the case of MOVPE, the MFP is several orders of magnitude smaller than the source to substrate distance. As a result, the various species can undesirably interact with themselves (such as recombination of excited dopant species) or among each other (such as parasitic reactions between Zn and Se precursors).

Conventionally, MOVPE growth of ZnSe occurs by the reaction of dimethylzinc with dimethylselenide at the substrate surface with temperatures above 500° C. and pressures of about 300 Torr. However, this has not led to sufficient nitrogen incorporation or a sufficient net acceptor concentration, primarily because of the compensation of nitrogen by hydrogen during growth. The possible sources of hydrogen are the carrier gases, the decomposition products of the organometallics, and the decomposition of ammonia when it is used as the source of nitrogen.

The precursor combination of DMZn and $H_2Se$ has been previously investigated in MOMBE and CBE. See Yoshikawa et al, "Growth Kinetics in MOMBE of ZnSe Using DimethylZinc and HydrogenSelenide As Reactants", *J. Cryst. Grow.*, 94, 69 (1989). This method uses ultra low pressure during growth, requires that the process be performed in ultrahigh vacuum MBE equipment, and does not use nitrogen doping.

Nitrogen plasma generated using a radio frequency (r.f.) plasma source has been used for acceptor doping in MBE. See Park et al, "p-type ZnSe By Nitrogen Atom Beam Doping During Molecular Beam Epitaxial Growth", *Appl. Phys. Lett.* 57, 2127 (1990) using MBE with elemental zinc and selenium; and Ohkawa et al, "Characteristics of p-type ZnSe Layers Grown By Molecular Beam Epitaxy With Radical Doping", *J. Appl. Phys.*, 30, L152 (1991) using MBE with elemental Zn and elemental Se as the growth sources grown under high pressures.

Microwave plasma source has also been used to generate a remote plasma using ammonia for nitrogen acceptor doping in conventional (3 Torr) MOVPE. See Huh et al, "Low Pressure MOVPE of ZnSe With Hydrogen Selenide and Dimethylzinc-Triethylamine", *J. Electron. Mat.* 22. 509, (May 1993)

There continues to be a need to further the ability to produce epitaxial layers of II–VI semiconductor compounds suitable for use in the growth of blue laser devices. The present invention provides such a method and novel epitaxial layers derived therefrom.

SUMMARY OF THE INVENTION

An object of this invention is to provide stable epitaxial layers of II–VI semiconductor compounds.

Another object of the invention is to provide a method for producing such layers.

These and other objects of the invention will be apparent in view of the description of the invention which follows.

In accordance with the invention, a method is provided for growing at least one epitaxial layer of a II–VI semiconductor compound using metal-organic vapor phase epitaxy (MOVPE), which method comprises the steps of subjecting a substrate to organometallic and hydride precursor compounds in a MOVPE reactor at pressures in the range of from about 10 to 1 mTorr.

According to preferred embodiments of the invention:

(A) nitrogen acceptors are incorporated in said epitaxial layer during growth; and/or (B) the nitrogen acceptors are incorporated into said layers using excited nitrogen species; and/or (C) the excitation of said nitrogen is performed at a spatial location remote from the growth surface; and/or (D) the growth is carried out in a chamber having a temperature in the range of about 200 to 400 degrees Centigrade and said excited nitrogen species are obtained using a remote microwave nitrogen plasma; and/or (E) the organometallic and hydride precursors are dimethylzinc or diethylzinc and hydrogen selenide; and/or (F) the dimethylzinc or diethylzinc and hydrogen selenide are preheated; and/or (G) the growth is photoassisted.

In accordance with especially preferred embodiments of the invention, a method is provided for growing at least one epitaxial layer of ZnSe using metal-organic vapor phase epitaxy (MOVPE), which method comprises the steps of subjecting a substrate to organometallic and hydride precursor compounds in a MOVPE reactor at pressures in the range of from about 10 to 1 mTorr, wherein the growth is carried out in a chamber having a temperature in the range of about 200 to 400° C.

Thus, a method is provided wherein epitaxial growth of ZnSe and its alloys is accomplished using a pressure regime in the 10 to 1 mTorr range during the growth. This constitutes a transition from laminar flow to a molecular flow regime. The MFP in this case is believed to be comparable to the source to substrate distance in a MOVPE reactor. As a result, when compared to conventional MOVPE, it is possible according to the invention to reduce the recombination of the excited dopant species prior to its arrival at the growth surface. In other words, the use of ultralow pressure during the epitaxial growth has been found to increase the lifetime of the activated nitrogen species, and thus the nitrogen incorporation during the epitaxial growth. Additionally, in accordance with the invention, the ultralow pressure conditions are preferably coupled with the use of a microwave plasma source which provides elemental N to the growth. Additionally, this process has been improved by the use of ultraviolet light to photoassist the growth of ZnSe.

These steps, individually and in combination have been found to result in the p-type doping of ZnSe using nitrogen as the dopant in accordance with the invention.

It is especially desirable that the nitrogen gas molecules be excited into higher energy molecular or atomic species using a remote plasma source. In an alternative embodiment, nitrogen-containing compounds are photolyzed using a laser beam to obtain nitrogen radicals. This step is performed at a location remote from the substrate surface thereby eliminating the possibility of damage to the surface of the substrate from the laser or the plasma.

According to yet another preferred embodiment of the invention, epitaxial growth of ZnSe and its alloys is accomplished at pressures in the 10 to 1 mTorr range in a MOVPE reactor using organometallic and hydride precursor compounds such as dimethylzinc and diethylzinc and a selenide precursor compounds and nitrogen acceptors are incorporated into these layers, during growth, by using excited nitrogen species where the excitation of nitrogen is performed at a spatial location remote from the growth surface.

In an especially preferred embodiment, ZnSe is doped with nitrogen atoms and excited nitrogen molecules from a plasma source which is spatially located far enough from the surface of the substrate to avoid disrupting growth or damaging the surface, while maintaining conditions under which the nitrogen cannot recombine or react with other species before reaching the surface. We have found that this can only be accomplished by lowering the pressure to the 10 to 1 mTorr, and preferably to the 5 to 1 mTorr range, thereby increasing the Mean Free Path (MFP) of the excited nitrogen species so that reactions between the chemical species substantially only occurs at the surface of the substrate. To achieve pressures in this range, a compound turbomolecular pump was installed on the growth chamber of a MOVPE reactor as described further hereinbelow.

We have found that another constraint is the reduction of growth temperatures from greater than 500° C. to below 400° C. so that the sticking coefficient of the nitrogen at the surface is improved. Thus, the incorporation of nitrogen acceptors is favored in the present method at growth temperatures in the 200–400° C. range, because the sticking coefficient is enhanced.

These temperatures and pressures can best be achieved by changing the growth chemistry to an organometallic zinc and selenide precursor in a nitrogen carrier gas to prevent reactions with hydrogen. Thus, MOVPE growth of ZnSe can be achieved under these conditions by photoassisted techniques which use organometallic precursors such as dimethylzinc (DMZn), diethylzinc (DEZn), dimethylselenide (DMSe), diethylselenide (DESe), etc. However, for a catalytic surface reaction to occur, a high partial pressure (flow) of hydrogen in the growth chamber is required. This high flow of hydrogen, however, has been found to preclude the attainment of the desired growth pressures of 10 to 1 mTorr. As a result, to mitigate this effect, in the process according to the invention, the organometallic Se precursor is replaced by the hydride precursor $H_2Se$. Under these conditions it is possible to grow high crystal quality ZnSe at low temperatures, for example, at 260° C. This is not intended to suggest that the method does not operate in the presence of hydrogen. To the contrary, hydrogen may be used at least partially as a carrier gas or may be present from other sources provided its presence is insufficient to prevent the use of ultra low pressure as contemplated herein. Preferably, hydrogen present in the method is minimized to assure that the ultra low pressures that are critical to the successful operation of the invention are realized.

BRIEF DESCRIPTION OF THE DRAWINGS

The invention will now be described in terms of the growth and evaluation of a series of epitaxial layers, with reference to the figures, in which.

DETAILED DESCRIPTION OF PREFERRED EMBODIMENTS

With reference to FIGS. 1 to 6, PL measurements were carried out on a series of ZnSe epitaxial layers grown on GaAs substrates in a MOVPE reactor over a temperature range of 200 to 400° C. at a pressure within the range of 10 to 1 mTorr, preferably 7 mTorr, using dimethylzinc and hydrogen selenide preheated to about 150° C. in a nitrogen carrier gas, to prevent reactions with hydrogen. Under these conditions, high crystal quality ZnSe was found to grow at temperatures of about 200 to 400° C., preferably about 240 to 275° C., and especially at 240° C. and 260° C., respectively. ZnSe layers doped with nitrogen were also grown using a remote plasma as the source of the dopant. The PL measurements were carried out while maintaining the samples at a temperature of about 6 to 10K. Excitation was achieved with an argon ion laser.

Figure 1:
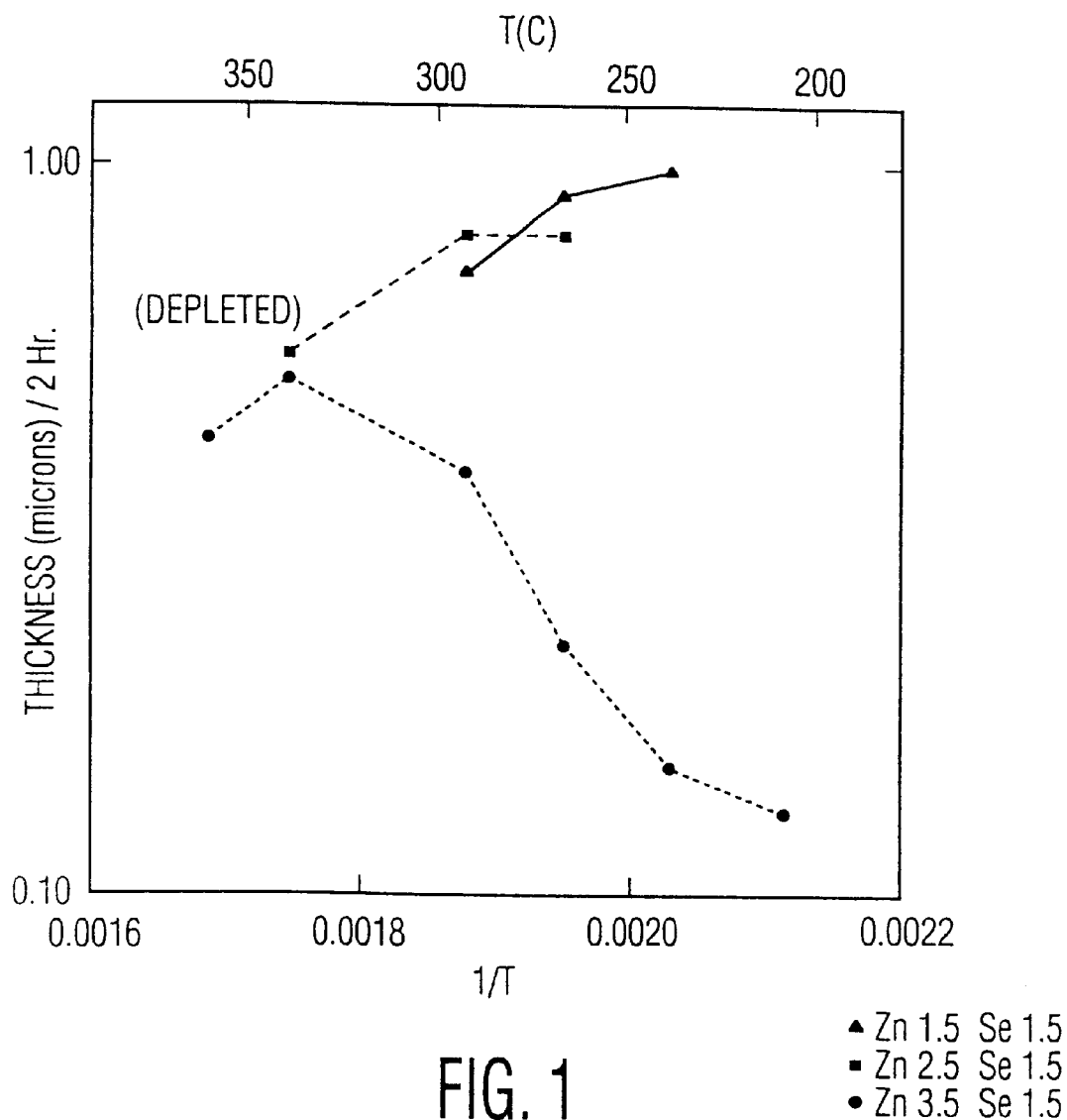
FIG. 1 is a graph illustrating the effect of preheating the organometallic and hydride precursors and relating the growth rate dependence on the substrate temperature.

FIG. 1 is a graph illustrating the growth rate of ZnSe layers as a function of temperature using various proportions of Zn and Se. It will be seen that the growth rate was best attained when equimolar proportions of the reactants were reacted at a temperature between about 240 and 260° C. ZnSe layers were grown using a laboratory scale CVD chamber which is a vertical flow, rotating disk reactor with reactant gas manifolds for fast switching of gases, and optical ports which allow photoassisted or plasma-assisted growth. The system has a load-lock chamber to speed substrate introduction, and the growth chamber is connected to a turbomolecular pump which allows low pressure growth. At the growth temperature, dimethylzinc and hydrogen selenide vapor flows were set at 1.5 sccm and 1.5 sccm, respectively. These conditions may vary to be within the range of 0.5 sccm and 15 sccm depending on the desired growth rate and the temperature of growth. Although the temperature will be within the ranges set forth herein, it will be understood that variations of about 10 to 30° C. are possible depending on the particular reactor size and the geometry of the flow. In a preferred embodiment using the reactor described above, hydrogen gas was bubbled through dimethylzinc at a rate of 2.1 sccm to achieve a take-up of about 1.5 sccm dimethylzinc at 0° C.; hydrogen gas was added to 10% hydrogen selenide at a rate of 15 sccm to achieve a take-up of 1.5 sccm $H_2S$; and nitrogen gas at a rate of 20 sccm from the plasma source were each fed to the reactor.

Figure 2A:
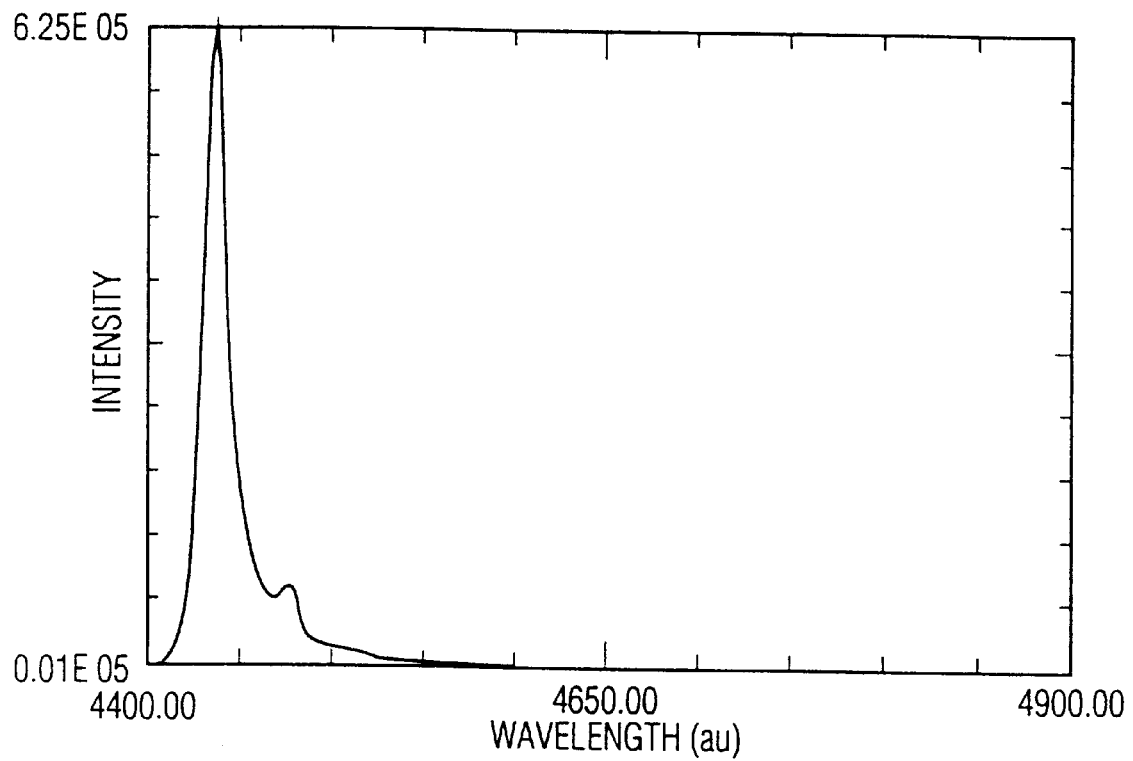
FIGS. 2a and 2b are photo-luminescence (PL) spectra of an epitaxial layer of ZnSe grown by ultralow pressure MOVPE at 240° C. in which intensity in arbitrary units is plotted versus wavelength in Angstroms of the PL excitation source.
Figure 2B:
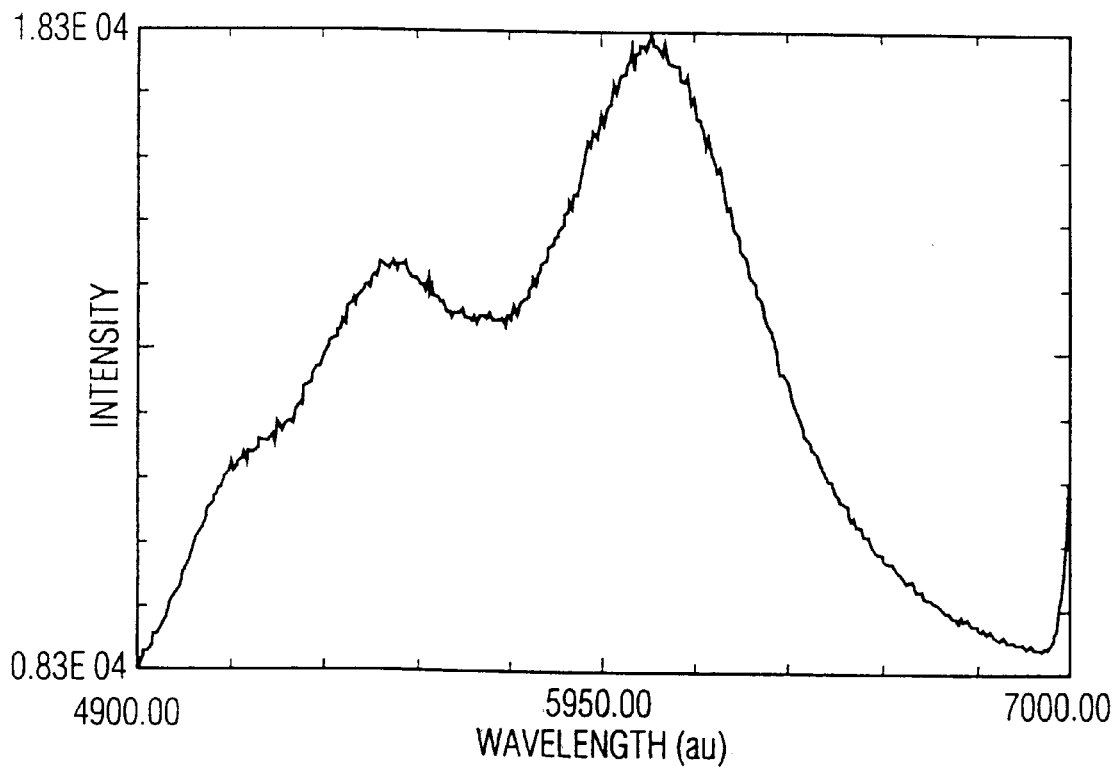

FIGS. 2a and 2b are photo-luminescence (PL) spectra of an epitaxial layer of ZnSe grown by MOVPE at 240° C., in which intensity in arbitrary units is plotted versus wavelength in Angstroms of the PL excitation source. The epi layers measured were produced as described above.

Figure 3A:
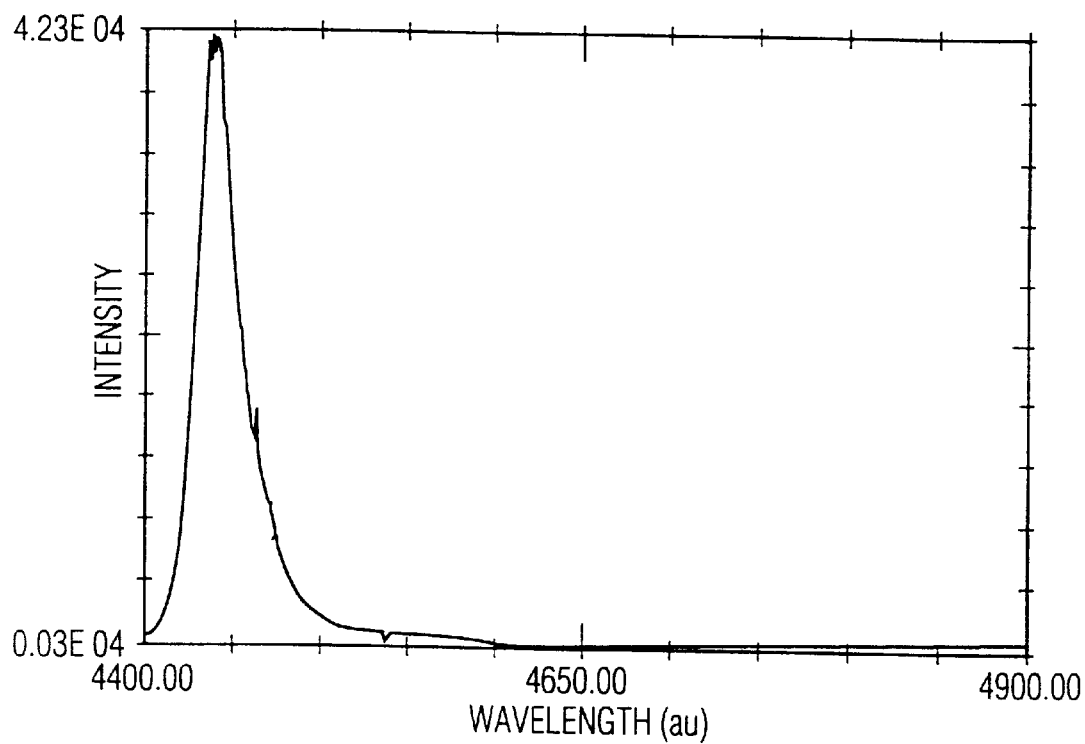
FIGS. 3a and 3b are PL spectra similar to those of FIG. 2 for a ZnSe epi layer grown by MOVPE at 240° C. and using unheated and preheated $H_2Se$.
Figure 3B:
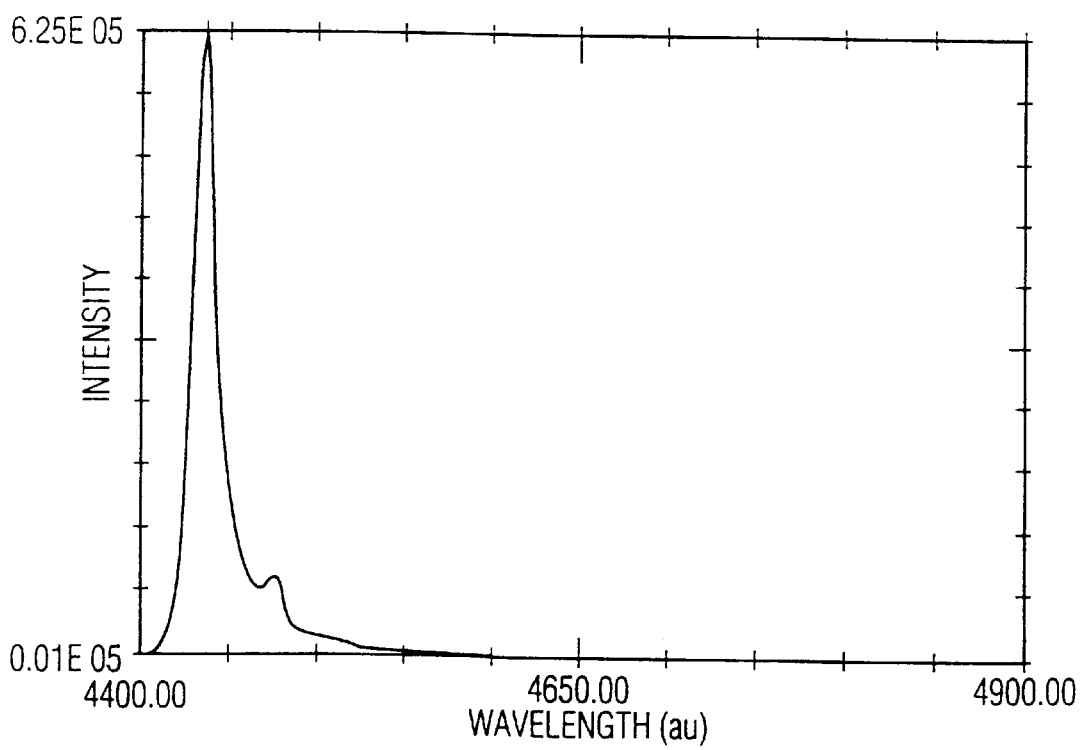

FIGS. 3a and 3b are PL spectra, similar to those of FIG. 2, for an undoped ZnSe epi layer using unheated and preheated $H_2Se$.

Figure 4:
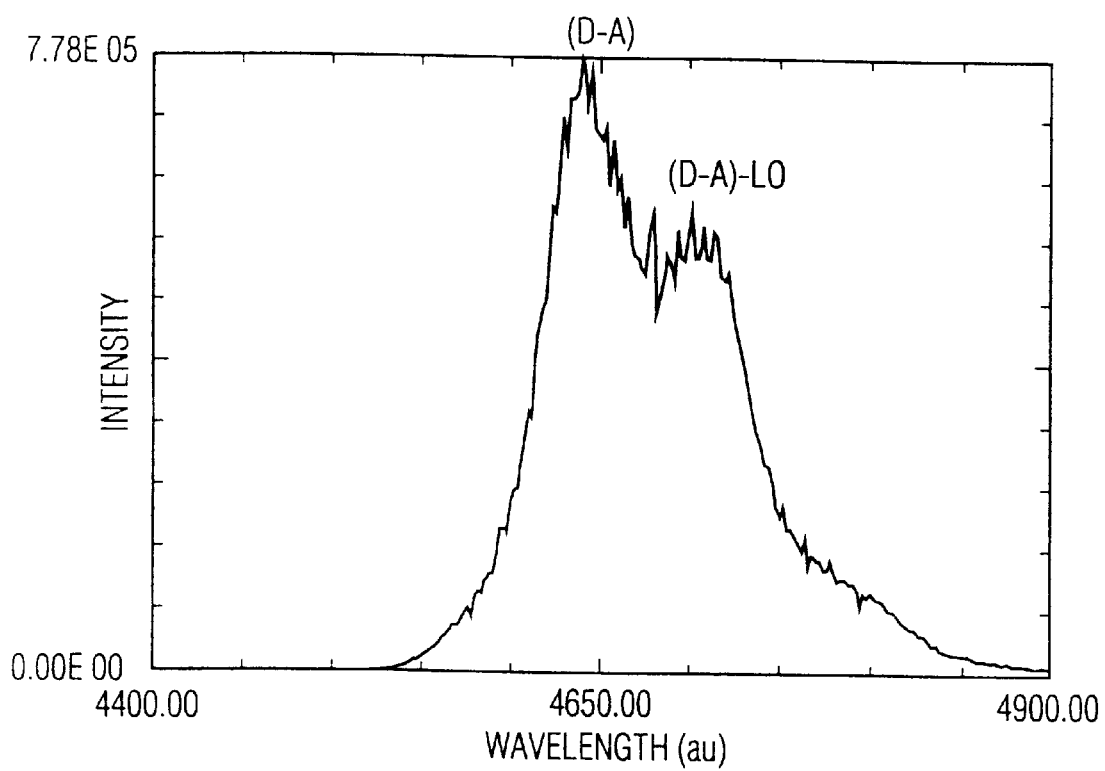
FIG. 4 is a PL spectrum for ZnSe epi layer doped with N grown by MOVPE at 240° C.

FIG. 4 is a PL spectrum for a photoassisted, nitrogen doped ZnSe layer grown according to the invention.

Figure 5:
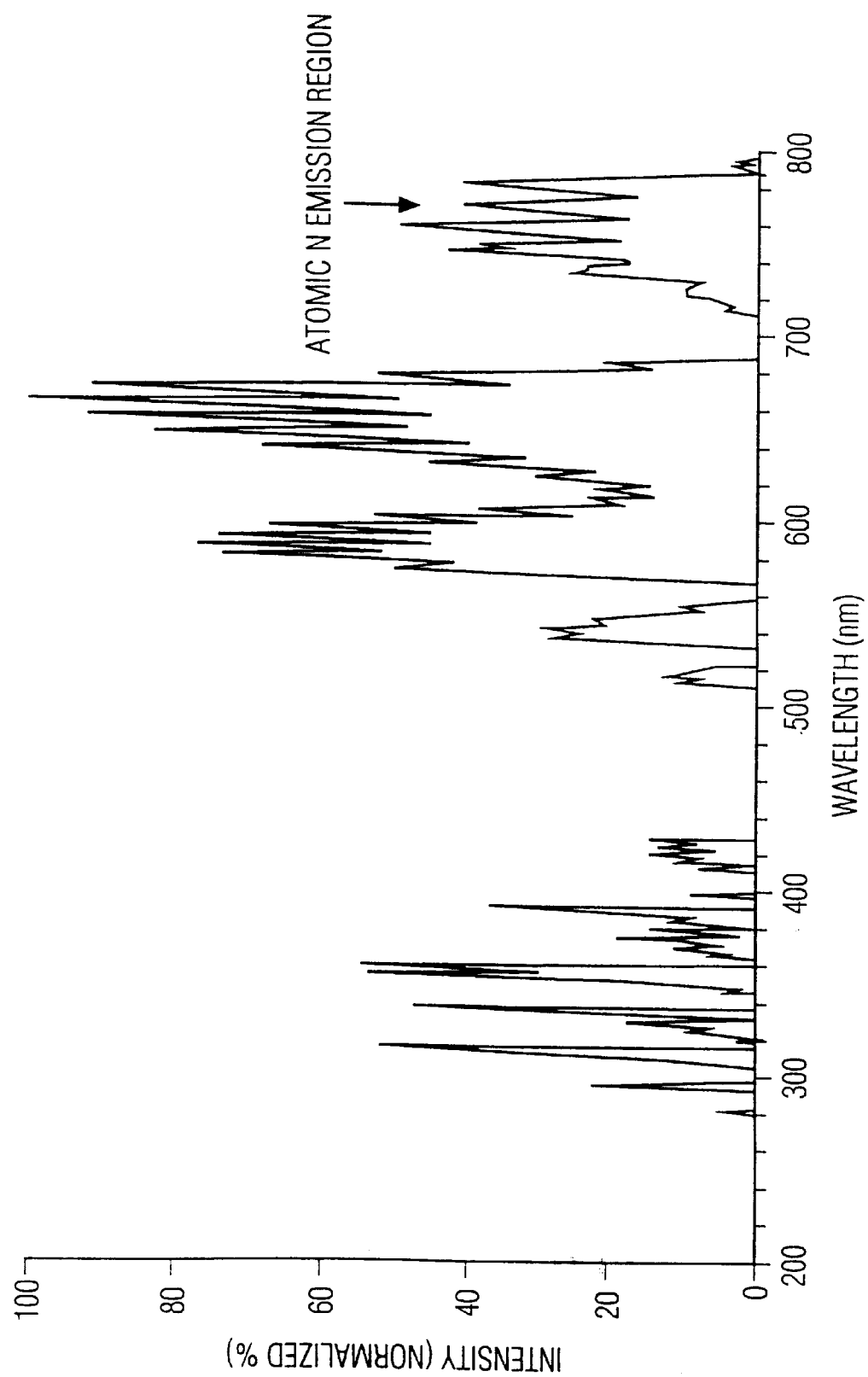
FIG. 5 is the optical emission spectra of a nitrogen plasma which is indicative of the atomic and molecular transitions of the excited nitrogen.

FIG. 5 is the optical emission spectra of a nitrogen plasma source used to produce epi layers as indicated in FIG. 4. The plasma is indicative of the atomic and molecular transitions of the excited nitrogen. Among the many factors which control the efficiency of doping, the nature of the excited species emitted by the plasma stands out as being critical. These species can be manipulated by controlling power, pressure and mode within the plasma cavity. FIG. 5 shows the optical emission spectra of the plasma which is indicative of the atomic and molecular transitions of the excited nitrogen. It is the nitrogen atoms and excited molecular $N_2$, as indicated in the spectra of FIG. 5, which appear to be the most productive for attaining satisfactory doping. Using the optical spectra as an indicator of species, we have found that it is possible to increase the relative concentration of the nitrogen atoms most effectively by increasing the pressure of nitrogen in the plasma source cavity. This is exemplified by the improvement in the normalized photoluminescent emission spectra shown in FIG. 6. The spectra of ZnSe doped with nitrogen using a low pressure plasma tube has an unacceptably low ratio of the red-shifted donor-acceptor-pair (D-A-P) emission (Approx. 4600 a.u.) to the deep level defects (Approx. 5600 a.u.), of approximately 4 to 1. The ZnSe doped layer using a higher pressure plasma tube is greatly improved, demonstrates a well defined D-A-P at 4625 au, and the ratio of D-A-P to deep levels is better than 1,100 to 1. Secondary ion mass spectroscopy has indicated that nitrogen incorporation is as high as $7 \times 10^{18}$ cm$^{-3}$, and the net acceptor is in the range of $5 \times 10^{15}$ to $5 \times 10^{16}$ cm$^{-3}$, after thermal annealing.

Figure 6:
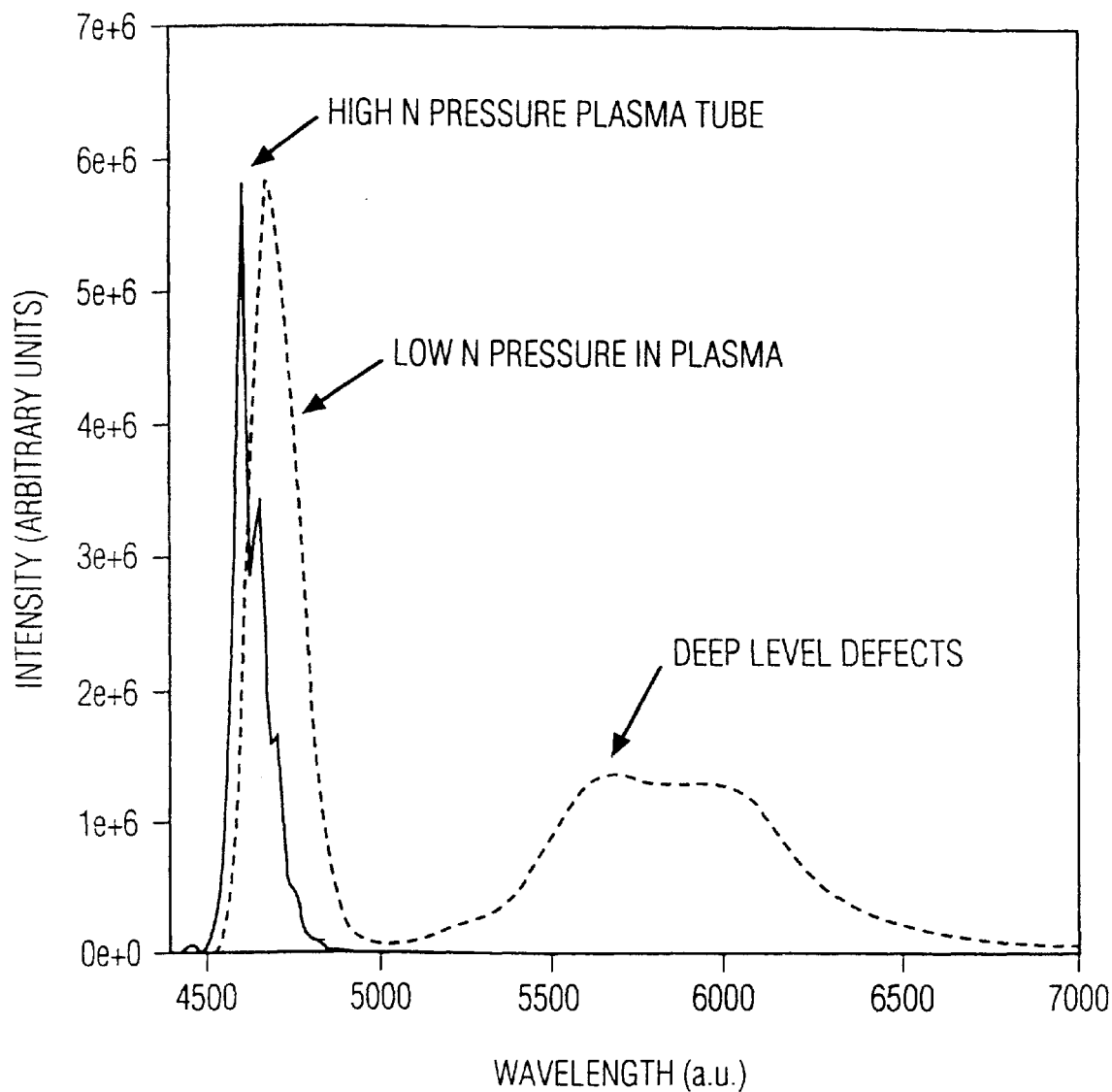
FIG. 6 is the PL emission spectra for doped ZnSe using a low pressure plasma tube and a high pressure plasma tube.

FIG. 6 is the PL emission spectra for doped ZnSe using a low pressure plasma tube and a high pressure plasma tube. As illustrated, we have found that changing the pressure of nitrogen in the plasma has a definite effect on the material characteristics. While the reasons for these effects are not known with certainty, it has been observed that when higher pressures are employed in the plasma tube, i.e. in the remote plasma generating source, more atomic nitrogen is generated resulting in improvements in the quality of the materials that are grown at the growth site under ultra low pressure conditions.

Layers of both p-type and n-type may be obtained with net donor concentrations, obtained by C-V measurements, in the $10^{16}$ to $10^{17}$ cm$^{-3}$ range.

We have demonstrated the growth of ZnSe epitaxial layers on GaAs substrates in a MOVPE reactor over a temperature range of 200 to 400° C. at a pressure of 7 mTorr. DimethylZinc and hydrogen selenide were used as the growth precursors. We have also demonstrated growth by preheating the Zn precursor to temperatures above approximately 150° C. Preheating the Se precursor had the effect of improving the crystal quality as determined by PL, in addition to improved morphology as illustrated in FIGS. 3a and 3b. As illustrated in FIG. 2a, the photoluminescence at 7K is dominated by the excitonic emission. FIG. 2 shows the intensity of the excitonic region in comparison to the deep levels which are indicative of compensating defects. Improvement in the quality of the layers grown by preheating the Se precursors is seen in FIG. 3 where the excitonic intensity is typically enhanced by a factor of approximately 15 and accompanied by narrower linewidths.

We have also demonstrated the growth of ZnSe epitaxial layers in the presence of the excited molecular and atomic radical species of nitrogen that were obtained using a remote microwave plasma source. We have demonstrated that ZnSe layers doped with nitrogen acceptors can be grown using a remote nitrogen plasma as a source of the dopant species at pressures in the 1 to 10 mTorr range by MOVPE. FIG. 4 shows the presence of Donor-Acceptor (D-A) spectra in PL of a layer grown at a pressure of 7 mtorr and about 290° C., in the presence of a remote microwave nitrogen plasma. The D-A-P spectra indicates the incorporation of nitrogen acceptors in the layer.

As will be appreciated by those skilled in the art, a variety of II–VI semiconductor materials may be produced by the method of the invention. Any of a variety of Zn and Se growth precursors may be used, in any combination, for example, Dimethyl Zinc, Diethyl Zinc, Diethyl selenide, Dimethyl Selenide, Hydrogen Selenide, etc.

Bandgap energy of the II–VI compounds of the invention typically range from about 3.7 eV (approx. 3300A) to 2.0 eV (approx. 6200A), for example, 2.45 eV (approx. 5000A) for ZnSe at a growth temperature of about 300° C. Suitable illumination sources for above and below bandgap photoassisted growth include high pressure lamps, e.g., Hg and xenon lamps (energy range about 5 eV (approx. 2500A) to about 1.55 eV (approx. 8000A), while above bandgap illumination could be provided, for example, by lasers, such as excited dimer (excimer) gas lasers (energy range about 6.42 eV to 3.53 eV). If the II–VI epi layer is grown directly on a GaAs substrate, then a buffer layer (e.g., approx. 100A in thickness) of the II–VI compounds can be grown first to facilitate the growth of the doped layer. This buffer layer could be grown using a variety of techniques.

The invention has been described in terms of a limited number of embodiments. However, it will be apparent that other embodiments and variations thereof are possible and are intended to be encompassed within the spirit and scope of the appended claims.

We claim:

1. A method for growing at least one epitaxial layer of ZnSe using metal-organic vapor phase epitaxy (MOVPE), which method comprises the steps of subjecting a substrate to organometallic and hydride precursor compounds in a MOVPE reactor at a pressure in the range of from about 10 to 1 mTorr, wherein the growth is carried out in a chamber having a temperature in the range of about 200 and 400 degrees Centigrade, the physical spacing between the precursor compound source and the substrate in the reactor being comparable to the mean free path whereby the organo-metallic and hydride precursor compounds react substantially at the substrate surface without substantial reaction in the gas phase.

2. A method as claimed in claim 1 wherein said organometallic and hydride precursors are dimethylzinc or diethylzinc and hydrogen selenide preheated to a temperature of about 150 degrees Centigrade.

3. A semiconductor compound comprising at least one epitaxial layer of a II–VI compound obtained by the method of claim 2.

4. A method as claimed in claim 2, wherein nitrogen acceptors are incorporated in said epitaxial layer during growth.

5. A semiconductor compound comprising at least one epitaxial layer of a II–VI compound obtained by the method of claim 4.

6. A method as claimed in claim 4, wherein said nitrogen acceptors are incorporated into said layers using excited nitrogen species.

7. A semiconductor compound comprising at least one epitaxial layer of a II–VI compound obtained by the method of claim 6.

8. A method as claimed in claim 6, wherein the excitation of said nitrogen is performed at a spatial location remote from the growth surface.

9. A method as claimed in claim 8, wherein said excited nitrogen species are obtained using a remote microwave nitrogen plasma.

10. A semiconductor compound comprising at least one epitaxial layer of a II–VI compound obtained by the method of claim 9.

11. A method as claimed in claim 9, wherein the growth is photoassisted.

12. A method as claimed in claim 1, wherein the substrate is GaAs.

13. A semiconductor compound comprising at least one epitaxial layer of a II–VI compound obtained by the method of claim 12.

14. A semiconductor compound comprising at least one epitaxial layer of a II–VI compound obtained by the method of claim 1.

15. A method for growing at least one epitaxial layer of p-ZnSe using metal-organic vapor phase epitaxy (MOVPE), which method comprises the steps of subjecting a substrate to organometallic and hydride precursor compounds in a MOVPE reactor at a pressure in the range of from about 10 to 1 mTorr, wherein the growth is carried out in a chamber having a separate source for the organometallic and hydride precursor compounds, and a temperature in the range of about 200 and 400 degrees Centigrade, the physical spacing between the precursor compound sources and the substrate in the reactor being comparable to the mean free path whereby the organo-metallic and hydride precursor compounds react at the substrate surface without substantial reaction in the gas phase.

16. A method as claimed in claim 15 wherein said organometallic and hydride precursors are dimethylzinc or diethylzinc and hydrogen selenide preheated to a temperature of about 150 degrees Centigrade.

17. A method as claimed in claim 16, wherein the substrate is GaAs.

18. A semiconductor compound comprising at least one epitaxial layer of a II–VI compound obtained by the method as claimed in claim 17.

19. A method as claimed in claim 16, wherein nitrogen acceptors are incorporated into said epitaxial layer during growth.

20. A method as claimed in claim 19, wherein the growth is photoassisted.

21. A semiconductor compound comprising at least one epitaxial layer of a II–VI compound obtained by the method as claimed in claim 20.

22. A semiconductor compound comprising at least one epitaxial layer of a II–VI compound obtained by the method as claimed in claim 19.

23. A semiconductor compound comprising at least one epitaxial layer of a II–VI compound obtained by the method as claimed in claim 16.

24. A semiconductor compound comprising at least one epitaxial layer of a II–VI compound obtained by the method as claimed in claim 15.

25. A method for growing at least one epitaxial layer of p-ZnSe using metal-organic vapor phase epitaxy (MOVPE), which method comprises the steps of subjecting a substrate to organometallic and hydride precursor compounds in a MOVPE reactor at a pressure in the range of from about 10 to 1 mTorr, wherein the growth is carried out in a chamber having a separate source for the organometallic and hydride precursor compounds, and a temperature in the range of about 200 and 400 degrees Centigrade, whereby the organometallic and hydride precursor compounds react at the substrate surface without substantial reaction in the gas phase.

26. A method as claimed in claim 25 wherein said organometallic and hydride precursors are dimethylzinc or diethylzinc and hydrogen selenide preheated to a temperature of about 150 degrees Centigrade.

27. A method as claimed in claim 26, wherein the substrate is GaAs.

28. A method as claimed in claim 27, wherein nitrogen acceptors are incorporated into said epitaxial layer during growth.

29. A method as claimed in claim 28, wherein the growth is photoassisted.

30. A semiconductor compound comprising at least one epitaxial layer of a II–VI compound obtained by the method as claimed in claim 25.

31. A method for growing at least one epitaxial layer of a II–VI semiconductor compound using metal-organic vapor phase epitaxy (MOVPE), which method comprises the steps of subjecting a substrate to organometallic and hydride precursor compounds in a MOVPE reactor at a pressure in the range of from about 10 to 1 mTorr and at a temperature in the range of about 200 and 400 degrees Centigrade, whereby the organo-metallic and hydride precursor compounds react at the substrate surface without substantial reaction in the gas phase.

32. A method as claimed in claim 31 wherein said organometallic and hydride precursors are dimethylzinc or diethylzinc and hydrogen selenide preheated to a temperature of about 150 degrees Centigrade.

33. A method as claimed in claim 32, wherein the substrate is GaAs.

34. A method as claimed in claim 33, wherein nitrogen acceptors are incorporated into said epitaxial layer during growth.

35. A method as claimed in claim 33, wherein the growth is photoassisted.

36. A semiconductor compound comprising at least one epitaxial layer of a II–VI compound obtained by the method as claimed in claim 31.

* * * * *